United States Patent [19]

Rogler

[11] Patent Number: 5,069,996
[45] Date of Patent: Dec. 3, 1991

[54] PROCESS FOR DEVELOPING SELECTED POSITIVE PHOTORESISTS

[75] Inventor: Robert F. Rogler, Rehoboth, Mass.

[73] Assignee: OCG Microelectronic Materials, Inc., Cheshire, Conn.

[21] Appl. No.: 408,849

[22] Filed: Sep. 18, 1989

Related U.S. Application Data

[63] Continuation-in-part of Ser. No. 383,468, Jul. 24, 1989, abandoned.

[51] Int. Cl.$^5$ .................. G03C 1/74; G03F 7/023; G03F 7/32
[52] U.S. Cl. ..................... 430/168; 430/165; 430/191; 430/192; 430/193; 430/309; 430/326; 430/331
[58] Field of Search ............... 430/326, 331, 309, 191, 430/190, 192, 168

[56] References Cited

U.S. PATENT DOCUMENTS

| | | | |
|---|---|---|---|
| 4,119,461 | 10/1978 | Yamada et al. | 430/94 |
| 4,374,036 | 2/1983 | Canale et al. | 430/309 |
| 4,711,836 | 12/1987 | Ferreira | 430/331 |
| 4,859,563 | 8/1989 | Miura et al. | 430/192 |
| 4,863,828 | 9/1989 | Kawabe et al. | 430/192 |
| 4,880,724 | 11/1989 | Toyama et al. | 430/331 |
| 4,886,728 | 12/1989 | Salamy et al. | 430/331 |
| 4,906,549 | 3/1990 | Asaumi et al. | 430/192 |

FOREIGN PATENT DOCUMENTS

| | | | |
|---|---|---|---|
| 295626 | 12/1988 | European Pat. Off. | 430/192 |
| 56-162746 | 12/1981 | Japan. | |
| 2212933 | 8/1989 | United Kingdom | 430/192 |

Primary Examiner—Charles L. Bowers, Jr.
Assistant Examiner—Thorl Chea
Attorney, Agent, or Firm—William A. Simons

[57] ABSTRACT

The process of developing an image-wise exposed positive-working photoresist-coated substrate comprising the steps of:

(1) coating said substrate with a radiation-sensitive composition useful as a photoresist; said composition comprising an admixture of:
 (a) at least one alkali-soluble binder resin;
 (b) at least one photoactive compound; and
 (c) a sufficient amount of at least one solvent to dissolve (a) and (b); subject to the proviso that said photoactive compound (b) is a mixture of fully and partially esterified o-naphthoquinone diazide esters of a polyhydroxyaromatic compound having at least four hydroxyl groups capable of being esterified by said diazide groups.

9 Claims, No Drawings

PROCESS FOR DEVELOPING SELECTED POSITIVE PHOTORESISTS

The present application is a continuation-in-part application of U.S. patent application Ser. No. 07/383,468, filed on July 24, 1989, now abandoned, by Robert F. Rogler. That parent application is incorporated herein by reference in its entirety.

The present invention also relates to an improved developer composition for developing photoresist compositions. Still further, the present invention relates to a process for coating, imaging, and developing selected radiation sensitive compositions useful as positive working photoresist.

Photoresist compositions are used in microlithographic processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards. The coated substrate is then baked to evaporate any casting solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate. In some processes, it is desirable to bake the imaged resist coating before this developing step. This intermediate step is sometimes called post-exposure bake or PEB.

There are two types of photoresist compositions—negative-working and positive-working. Examples of both types of photoresists are well documented in "Introduction to Microlithography", L. F. Thomson, C. G. Willson, and M. J. Bowden, Eds., ACS Symposium Series, 1983.

When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to a developing solution. Thus, treatment of an exposed negative-working resist with a developer solution causes removal of the non-exposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g. a rearrangement reaction occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, a desired portion of the underlying substrate surface is uncovered.

Positive-working photoresist compositions are currently favored over negative-working resists because the former generally have better resolution capabilities and pattern transfer characteristics.

In some instances, it is desirable to heat treat the remaining resist layer after the development step and before the following etching step to increase its adhesion to the underlying substrate and its resistance to etching solutions.

After this development operation, the now partially unprotected substrate may be treated with a substrate-etchant solution or plasma gases. This latter technique is called plasma etching or dry etching. The etchant solution or plasma gases etch the portion of the substrate where the photoresist coating was removed during development. The areas of the substrate where the photoresist coating still remains are protected and, thus, an etched pattern is created in the substrate material which corresponds to the photomask used for the image-wise exposure of the radiation.

In addition, it is generally desirable that the developed photoresist wall profiles to be near vertical relative to the substrate and no resist residue be present on the substrate surface on the exposed and developed areas. Such demarcations between developed and undeveloped areas of the resist coating translate into accurate pattern transfer onto the substrate.

The formation of a latent image on the photoresist coating by the imagewise exposure of the coating with radiant energy and the conversion of this latent image to a suitable relief image on the coating by the developer solution may be dependent upon several processing variables, including:

1. Photoresist coating thickness
2. Photoresist soft baking temperature
3. Radiant Energy Type (e.g., UV light or electron beam current)
4. Radiant Energy Amount
5. Developer Type
6. Developer Concentration
7. Development Temperature
8. Development Time
9. Development Mode (e.g., immersion or spray or both)

These parameters are frequently played against each other to balance the sometimes-conflicting goals of the overall microlithographic operation (e.g., amount of throughput, degree of image dimension control, and resolution desired as well as process latitude). This parameter balancing may be aided in the case of positive-working photoresist coating if a developer solution is selected which has a rapid dissolution rate of the exposed areas of the resist coating while relatively unaffecting the unexposed areas of the resist as well as also providing good image quality, developed image dimension (DID) control and process latitude.

In the past, numerous aqueous developing solutions have been known in the photoresist art for use with positive-working resist coatings. Generally, there are three classes of these developing solutions. They are metal-containing developers, metal ion-free developers, and organic solvent developers.

Known metal ion-free developers include aqueous solutions of tetramethylammonium hydroxhide (TMAH) and novolak-type resins. See Japanese Kokai No. 56/162,746 published on December, 1981 and U.S.

Pat. No. 4,711,836 which issued to Ferreira on Dec. 8, 1987. Such development solutions have been used in conjunction with positive-working photoresist formulations which comprise an admixture of (a) at least one alkali-soluble binder resin (e.g., 45% by weight meta-/55% by weight para-cresol/formaldehyde novolaks); (b) o-naphthoquinone diazide esters of polyhydroxy aromatic compounds having no more than 3 hydroxyl groups capable of being esterified by said diazide groups (e.g., trihydroxy-benzophenone) in (c) a solvent system.

These prior art processes used aqueous tetramethylammonium hydroxide (TMAH) and novolak resin-containing developing solutions in conjunction with these trihydroxy esters of o-naphthoquinone diazides are acceptable for making imaged patterns down to a resolution of about 1.0 micron lines and spaces. However, such processes are not acceptable when better resolution is necessary (i.e., about 0.6–0.5 micron lines and spaces). The present invention provides an improved process over those known systems.

Accordingly, the present invention is directed to the process of developing an image-wise exposed positive-working photoresist-coated substrate comprising the steps of:

(1) coating said substrate with a radiation-sensitive composition useful as a photoresist; said composition comprising an admixture of:
  (a) At least one alkali-soluble binder resin;
  (b) at least one photoactive compound; and
  (c) a sufficient amount of at least one solvent to dissolve (a) and (b); subject to the proviso that said photoactive compound (b) is a mixture of fully and partially esterified o-naphthoquinone diazide esters of a polyhydroxyaromatic compound having at least four hydroxyl groups capable of being esterified by said diazide groups;
(2) subjecting said coating on said substrate to an image-wise exposure of radiation energy; and
(3) subjecting said image-wise exposed coated substrate to a developing solution to form an image-wise pattern in the coating, said developing solution comprising an aqueous solution of tetramethylammonium hydroxide which contains about 0.10 to about 1.0% by weight of a novolak-type resin.

As mentioned above, the photosensitive compositions used in the process of the present invention have three critical ingredients; at least one alkali-soluble binder resin; at least one photoactive compound; and a solvent.

Any or all alkali-soluble binder resins commonly employed in positive-working photoresist compositions may be used herein. The preferred class of binder resins are phenolic novolak resins. Examples of these include phenolic-formaldehyde resins, cresol-formaldehyde resins, and phenol-cresol-formaldehyde resins commonly used in the photoresist art. Polyvinylphenol resins may also be suitable.

Any and all o-naphthoquinone diazide photoactive compounds (sometimes called photosensitizers) which make light-sensitive mixtures useful in positive-working photoresists may be employed herein, as long as the above-noted proviso that at least four esterifiable hydroxyls is met.

One preferred class of photoactive compounds is o-quinonediazide compounds, particularly esters derived from polyhydric phenols, alkyl-polyhydroxyphenones, aryl-polyhydroxyphenones, and the like which contain from four to six or more sites for esterification. The most preferred o-quinonediazide esters are derived from 2-diazo-1,2-dihydro-1-oxo-naphthalene-4-sulfonic acid and 2-diazo-1,2-dihydro-1-oxo-naphthalene-5-sulfonic acid.

Specific examples include 1,2-quinonediazidesulfonic acid esters of such (poly)hydroxyphenyl alkyl ketones or (poly)hydroxyphenyl aryl ketones such as 2,2',4,4'-tetrahydroxy-benzophenone 1,2-naphthoquinonediazide-5-sulfonic acid esters, 2,3,4,4'-tetrahydroxybenzophenone 1,2-naphthoquinonediazide-5-sulfonic acid esters, 2,3,4,4'-tetrahydroxybenzophenone 1,2-naphthoquinone-diazide-4-sulfonic acid esters, 2,2',3,4',6'-penta-hydroxybenzophenone 1,2-napthoquinonediazide-5-sulfonic acid esters and 2,3,3',4,4',5'-hexahydroxybenzophenone 1,2-naphthoquinonediazide-5-sulfonic acid esters. In addition, these materials may be used in combinations of two or more. Further, mixtures of substances formed when less than all esterification sites present on a particular polyhydric phenol, alkyl-polyhydroxyphenone, aryl-polyhydroxyphenone and the like have combined with o-quinonediazides may be effectively utilized in positive acting photoresists.

Of all the 1,2-quinonediazide compounds mentioned above, 1,2-naphthoquinonediazide-5-sulfonic acid di-, tri-, tetra-, penta- and hexa-esters of polyhydroxy compounds having at least 4 hydroxyl groups, i.e. about 4 to 6 hydroxyl groups, are most preferred.

Among these most preferred 1,2-naphthoquionone-5-diazide compounds are 2,3,4,4'-tetrahydroxybenzophenone 1,2-naphthoquinone-diazide-5-sulfonic acid esters, and 2,2',4,4'-tetra-hydroxybenzophenone 1,2-naphthoquinonediazide-5-sulfonic acid esters. These 1,2-quinonediazide compounds may be used alone or in combination of two or more.

Another preferred class of photoactive o-quinonediazide compounds is prepared by condensing spirobiindane or spirobichroman derivatives with 1,2-naphthoquinone-diazido-5-sulfonyl chloride or 1,2-naphothoquione-diazido-4-sulfonyl chloride or a mixture thereof to make compounds of formula (A) shown below:

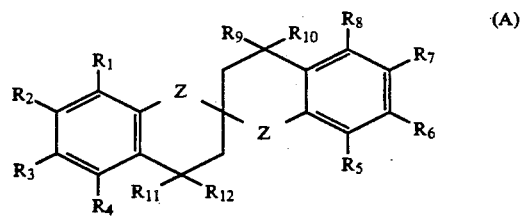

wherein $R_1$ to $R_8$ are independently hydrogen, a hydroxyl group, a halogen atom, an alkyl group, an alkoxy group, an aralkyl group, an aryl group, an amino group, a monoalkylamino group, a dialkylamino group, an acylamino group, an alkylcarbamoyl group, an arylcarbamoyl group, an alkylsulfamoyl group, an arylsulfamoyl group, a carboxyl group, a cyano group, a nitro group, an acyl group, an alkyloxycarbonyl group, an aryloxycarbonyl group, an acyloxy group,

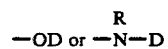

(wherein R is hydrogen, or an alkyl group, and D is a 1,2-naphthoquinonediazido-5-sulfonyl group or a 1,2- naphthoquinonediazido-4-sulfonyl group); $R_9$ to $R_{12}$ are independently hydrogen or a lower alkyl group; and Z is oxygen or a single bond (i.e. the latter forms a five-member ring); provided that at least four of $R_1$ to $R_8$ is —OH or —OD.

The halogen represented by $R_1$ to $R_8$ in the formula (A) is preferably chlorine, bromine or iodine.

The alkyl group is preferably an alkyl group having 1 to 4 carbon atoms, such as methyl, ethyl, propyl, isopropyl, n-butyl, isobutyl, sec-butyl and tert-butyl.

The alkoxy group is preferably an alkoxy group having 1 to 4 carbon atoms, such as methoxy, ethoxy, hydroxyethoxy, propoxy, hydroxypropoxy, isopropoxy, n-butoxy, isobutoxy, sec-butoxy and tert-butoxy.

The aralkyl group is preferably a benzyl group, a phenethyl group or a benzhydryl group.

The aryl group is preferably phenyl, tolyl, hydroxyphenyl or naphthyl.

The monoalkylamino group is preferably a monoalkylamino group having 1 to 4 carbon atoms, such as monomethylamino, monoethylamino, monopropylamino, monoisopropylamino, mono-n-butylamino, monoisobutylamino, mono-sec-butylamino, or mono-tert-butylamino.

The dialkylamino group is preferably a dialkylamino group with each akyl substituent having 1 to 4 carbon atoms, such as dimethylamino, diethylamino, dipropylamino, di-isoprop ylamino, di-n-butylamino, di-iso-butylamino, di-sec-butylamino, or di-tert-butylamino.

The acylamino group is preferably an aliphatic group-substituted acylamino group such as acetylamino, propionylamino, butylamino, isobutylamino, isovalerylamino, pivaloylamino or valerylamino, or an aromatic group-substituted acylamino group such as benzoylamino or toluoylamino.

The alkylcarbamoyl group is preferably an alkylcarbamoyl group having 2 to 5 carbon atoms, such as methylcarbamoyl, ethylcarbamoyl, propylcarbamoyl, isopropylcarbamoyl, n-butylcarbamoyl, isobutylcarbamoyl, sec-butylcarbamoyl or tert-butylcarbamoyl.

The arylcarbamoyl group is preferably phenylcarbamoyl or tolylcarbamoyl.

The alkylsulfamoyl group is preferably an alkylsulfamoyl group having 1 to 4 carbon atoms, such as methylsulfamoyl, ethylsulfamoyl, propylsulfamoyl, isopropylsulfamoyl, n-butylsulfamoyl, sec-butylsulfamoyl, or tert-butylsulfamoyl.

The arylsulfamoyl group is preferably phenylsulfamoyl or tolylsulfamoyl.

The acyl group is preferably an aliphatic acyl group having 1 to 5 carbon atoms, such as formyl, acetyl, propionyl, butyryl, isobutyryl, valeryl, isovaleryl or pivaloyl, or an aromatic acyl group, such as benzoyl, toluoyl, salicyloyl or naphthoyl.

The alkyloxycarbonyl group is preferably an alkyloxycarbonyl group having 2 to 5 carbon atoms, such as methoxycarbonyl, ethoxycarbonyl, propoxycarbonyl, isopropoxycarbonyl, n-butoxycarbonyl, isobutoxycarbonyl, sec-butoxycarbonyl or tert-butoxycarbonyl.

The aryloxycarbonyl group is preferably phenoxycarbonyl.

The acyloxy group is preferably an aliphatic acyloxy group having 2 to 5 carbon atoms, such as acetoxy, propionyloxy, butyryloxy, isobutyryloxy, valeryloxy, isovaleryloxy or pivaloyloxy, or an aromatic acyloxy group such as benzoyloxy, toluoyloxy or naphthoyloxy.

The lower alkyl group represented by $R_9$ to $R_{12}$ in the formula (A) is preferably an alkyl group having 1 to 4 carbon atoms, such as methyl, ethyl, propyl, isopropyl, butyl, isobutyl, sec-butyl or tert-butyl.

In the formula (A) above, $R_1$ to $R_8$ are preferably a hydrogen atom, a hydroxy group or an —OD group wherein D is as defined above and subject to the proviso that at least four of $R_1$ to $R_8$ are —OH or —OD, and $R_9$ to $R_{12}$ are preferably a hydrogen atom or a methyl group. R is preferably an alkyl group having 1 to 4 carbon atoms, such as a methyl ethyl, n-propyl, iso-propyl, n-butyl, iso-butyl, sec-butyl or t-butyl group.

The proportion of the photoactive compound in the radiation-sensitive mixtures may range from about 5% to about 40%, more preferably from about 10% to about 25% by weight of the non-volatile (e.g. non-solvent) content of the radiation-sensitive mixture. The proportion of total binder resin of this present invention in the radiation-sensitive mixture may range from about 60% to about 95%, preferably, from about 75% to 90% by weight, of the non-volatile (e.g. excluding solvents) content of the radiation-sensitive mixture.

The solvent may be any of the solvents conventionally used to dissolve photoresist compositions for coating purposes. These include ethyl lactate, aliphatic alkylene glycol alkyl ethyl esters, cyclohexanone, methyl cellosolve acetate, ethyl cellosolve acetate, butyl acetatge, xylene, and mixtures thereof. Particularly preferred solvents are ethyl lactate, a mixture of ethyl lactate and ethyl 3-ethoxy propionate, ethyl cellosolve acetate, or a mixture of ethyl cellosolve acetate, butyl acetate, and xylene. The mixture of ethyl lactate and ethyl 3-ethoxy propionate is most preferred. The choice of solvent will depend on the specific novolak-type resin and specific diazoketone employed.

The binder resin and photoactive compound or sensitizer are dissolved in the solvent mixture mentioned above to facilitate their application to the substrate. The preferred amount of solvent may be from about 50% to about 500%, or higher, by weight, more preferably, from about 100% to about 400% by weight, based on combined resin and photoactive compound weight. Preferably, the weight ratio of ethyl lactate to ethyl 3-ethoxy propionate is from about 40:60 to 75:25; more preferably, from about 50:50 to 70:30.

These radiation-sensitive mixtures may also contain, besides the resin, photoactive compound, and solvent, conventional photoresist composition ingredients such as other resins, actinic and contrast dyes, anti-striation agents, speed enhancers, and the like. These additional ingredients may be added to the binder resin, photoactive compound and solvent mixture solution before the solution is coated onto the substrate.

Actinic dyes help provide improved critical dimension control on highly reflective surfaces by inhibiting back scattering of light off the substrate. This back scattering causes the undesirable effect of optical notching, especially on a substrate topography. Examples of actinic dyes include those that absorb light energy at approximately 400-460 nm [e.g. Fat Brown B (C.I. No. 12010); Fat Brown RR (C.I. No. 11285); 2-hydroxy-1,4-naphthoquinone (C.I. No. 75480) and Quinoline yellow A (C.I. No. 47000)] and those that absorb light energy at approximately 300-340 nm [e.g. 2,5-diphenyloxazole (PPO-Chem. Abs. Reg. No. 92-71-7) and 2-(4-biphenyl)-6-phenyl-benzoxazole (PBBO-Chem. Abs.

Reg. No. 17064-47-0)]. The amount of actinic dyes may be up to 10% weight levels, based on the combined weight of resin and photoactive compound.

Contrast dyes enhance the visibility of the developed images and facilitate pattern alignment during manufacturing. Examples of contrast dye additives that may be used together with the radiation-sensitive mixtures of the present invention include Solvent Red 24 (C.I. No. 26105), Basic Fuchsin (C.I. 42514), Oil Blue N (C.I. No. 61555) and Calco Red A (C.I. No. 26125) up to 10% weight levels, based on the combined weight of resin and photoactive compound.

Anti-striation agents level out the photoresist coating or film to a uniform thickness. Anti-striation agents may be used up to five % weight levels, based on the combined weight of resin and photoactive compound. One suitable class of anti-striation agents is non-ionic silicon-modified polymers. Nonionic surfactants may also be used for this purpose, including, for example, nonylphenoxy poly(ethyleneoxy) ethanol; octylphenoxy (ethyleneoxy) ethanol; and dinonyl phenoxy poly(ethyleneoxy) ethanol.

Speed enhancers tend to increase the solubility of the photoresist coating in both the exposed and unexposed areas, and thus, they are used in applications where speed of development is the overriding consideration even though some degree of contrast may be sacrificed, i.e. in positive resists while the exposed areas of the photoresist coating will be dissolved more quickly by the developer, the speed enhancers will also cause a larger loss of photoresist coating from the unexposed areas. Speed enhancers that may be used include, for example, picric acid, nicotinic acid or nitrocinnamic acid at weight levels of up to 20%, based on the combined weight of resin and sensitizer.

The prepared radiation-sensitive resist mixture, can be applied to a substrate by any conventional method used in the photoresist art, including dipping, spraying, whirling and spin coating. Spin coating is the most preferred method today. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, doped silicon, aluminum, polymeric resins, silicon dioxide, doped silicon dioxide, silicon resins, gallium arsenide, aluminum gallium arsenide, titanium, tantalum, molybdenum, tungsten, titanium silicides, tantalum silicides, molybdenum silicides, tungsten silicides, silicon nitride, copper, polysilicon, ceramics and aluminum/copper mixtures.

The photoresist coatings produced by the above described procedure are particularly suitable for application to silicon/silicon dioxide-coated or polysilicon or silicon nitride wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate is soft baked at approximately 70° C. to 125° C. until substantially all the solvent has evaporated and only a uniform radiation-sensitive coating remains on the substrate.

The coated substrate can then be exposed to radiation, especially ultraviolet radiation, in any desired exposure pattern, produced by use of suitable masks, negatives, stencils, templates, and the like. Conventional imaging processes or apparatus currently used in processing photoresist-coated substrates may be employed with the present invention. In some instances, a post-exposure bake (PEB) may be used to remove standing waves from the side walls of the imaged lines.

The exposed resist-coated substrates are next developed in an aqueous metal ion-free developing solution mentioned above. If immersion developed, the developer solution is preferably agitated, for example, by nitrogen gas agitation. The preferred aqueous metal ion-free developers include aqueous solutions of tetramethylammonium hydroxide (preferably about 2% to about 4% by weight of the developer solution) and mixed cresol novolaks (preferably about 0.2% to about 0.5% by weight of developer solution). The most preferred mixed cresol novolaks are made from mixtures containing from 25% by weight meta-cresol and 75% by weight para-cresol to 75% by weight meta-cresol and 25% by weight para-cresol that were reacted with formaldehyde.

The aqueous metal ion-free developing solution can optionally contain various other standard ingredients as will be apparent to those skilled in the art. For example, the developing solution may also include dye and/or pigments, surfactants, defoamers and the like.

Suitable wetting surfactants include Poly-Tergent S-305 LF; Poly-Tergent S-405 LF; Poly-Tergent P-17A; PIONIN P-4050-T; Marlophen 89; SURFYNOL 440 ethoxylated tetramethyldecynediol.

The amount of such wetting surfactant should be sufficient to provide good solubility of the developer solution to the photoresist-coated substrate. The preferred amounts of the wetting surfactant should be about 0.01% to about 0.10% by weight of the developer solution.

Suitable defoamers include SAG10 and SAG1010 dimethylpolysiloxane emulsions.

The amount of such defoamers should be sufficient to provide good defoaming properties to the developer solution. The preferred amounts of the defoamer should be about 0.001% to 0.01% by weight of the developer solution.

The developing solution may also include an alkaline-soluble antioxidant in amounts of less than 0.1% by weight, based on the total weight of the developing solution. Another optional ingredient is phloroglucinol which may be present in amounts less than about 0.2% by weight of the total developer solution.

It also should be apparent to those skilled in the art that an aqueous concentrate of the developing solution of the present invention can be prepared which can be diluted with more water prior to use as the developing solution. This concentrate may be advantageous in that it would reduce the amount of water which must be stored or shipped.

By employing the above-noted combination of developing ingredients in an aqueous solution, the exposed areas of the positive-working photoresist composition are removed by the aqueous developing composition while the unexposed areas are relatively unaffected. Thus, the exposed areas of the photoresist may be removed without leaving a residue between the edges or surfaces of the unexposed areas and the substrate.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In the manufacture of microcircuitry units, the developed substrates may then be treated with a plasma gas etch employing conventional plasma processing parameters (e.g., pressure and gas flow rates) and conventional plasma equipment.

Later, the remaining areas of the photoresist coating may be removed from the etched substrate surface by conventional photoresist stripping operations.

Another embodiment of the present invention is preferred developer solutions which are exemplified by Example 25 below. Accordingly, the present invention encompasses a developer solution which comprises:

(a) about 2.0–2.5% by weight tetramethylammonium hydroxide;
(b) about 0.1–0.5% by weight of a novolak resin formed by the reaction of a cresol mixture of m-cresol and p-cresol with formaldehyde;
(c) about 0.01–0.10% by weight of an ethoxylated tetramethyldecynediol surfactant;
(d) about 0.001% to 0.01% by weight dimethylpolysiloxane emulsion defoamer; and
(e) balance being water.

The present invention is further described in detail by means of the following Examples and Comparisons. All parts and percentages are by weight unless explicitly stated otherwise.

EXAMPLES 1–10 AND COMPARISON 1

Photoresist Components

The specific photoresist components used in the following formulation are described herein.

Photoactive Component (PAC) was formed by the reaction of 2,2',3,3'-tetrahydro-3,3,3',3'-tetramethyl-1,1'-spirobi (1H-indene)-5,5',6,6',7,7'-hexol (CAS Registry No. 32737-33-0) with 6-diazo-5,6-dihydro-5-oxo-1-naphthalenesulfonyl chloride as described in a Japanese Patent Application filed Sept. 17, 1987 and assigned to Fuji Photo Film Co. Ltd.

The novolak resin (binder) was formed by the reaction of 40 grams m-cresol and 60 grams p-cresol with 54 grams of 37% aqueous formalin in the presence of 0.05 grams of oxalic acid as catalyst. Novolak was isolated after heating at 150° C. and removing unreacted monomers and water at reduced pressure.

A mixture of ethyl lactate and ethyl 3-ethoxy propionate were used as the solvent system. The percentages by weight of the four components were as follows:

| Photoactive Compound | 5.2% |
|---|---|
| Novolak Binder | 20.8 |
| Ethyl Lactate | 48.1 |
| Ethyl 3-Ethoxy Propionate | 25.9 |
| | 100.0%. |

Photoresist Formulation

The photoresist formulation used in these Examples, 1–10 and Comparison, was made by adding the components listed above to a round bottle which was placed on a roller mill to agitate. Agitation was continued until complete solution, as determined by visual inspection, was attained. Resist solutions were then passed through a 0.2 micron filter to remove particulates and gels.

Developer Formulations

Ten different developer formulations were prepared employing deionized water, tetramethylammonium hydroxide (TMAH) and a novolak-type resin. The Comparison 1 developer did not contain a novolak-type resin. Optionally, a wetting surfactant (i.e., SURFYNOL 440 ethoxylated tetramethyldecynediol which is the reaction product of ethylene oxide with 2,4,7,9-tetramethyl-5-decyn-4,7-diol available from Air Products and Chemicals, Inc. of Allentown, Pa. 18195) was added to Examples 7–10 developer formulations. Another optional ingredient was a deformer (e.g., Witco Bubble Breaker 625 available from Witco Corporation of Houston, Tex. 77045 was added in the Example 9 developer formulation or SAG 10, Silicon Antiform Emulsion, a polydimethylsiloxane emulsion available from Union Carbide Corporation of Tarrytown, N.Y. 10591 was added to the Example 10 developer formulation.

Among the novolak-type resins used in these developer formulations are the following:

Novolak A was a novolak resin formed by the reaction of 45% by weight m-cresol and 55% p-cresol with formaldehyde. This Novolak A is a commercially available novolak from Schenectady Chemicals, Inc. of Schenectady, N.Y. (i.e., HRJ 10714 1151-65A novolak which has an average molecular weight ($M_w$) of about 10,000).

Novolak B was a novolak resin formed by the reaction of 75% by weight meta-cresol and 25% by weight para-cresol reacted with formaldehyde. This Novolak B is a commercially available novolak available from Borden Chemical of Columbus, Ohio 43215. (Resin SD-140-A/L8D 014 which has an average molecular weight ($M_w$) of about 6,900.)

Novolak C was a novolak resin formed by the reaction of 40% by weight meta-cresol and 60% by weight para cresol with formaldehyde. This Novolak C is a commercially available novolak from Borden Chemicals (Resin SD 258A L9B 0207 which has an average molecular weight ($M_w$) of about 3,800.)

Novolak D was a novolak resin formed by the reaction of 45% by weight meta-cresol and 55% by weight para-cresol reacted with formaldehyde. This Novolak D is a commercially available novolak from Schenectady Chemicals (Resin HRJ 10714 1151–65B which has an average molecular weight ($M_w$) of about 5,700).

The various developer formulations tested are shown in Table I below:

TABLE 1

Developer Formulations

| Example | Deionized Water (% By Wt.) | TMAH (% By Wt.) | Novolak | Novolak (% By Wt.) | Wetting Surfactant (% By Wt.) | Defoamer (% By Wt.) |
|---|---|---|---|---|---|---|
| 1 | 97.43 | 2.38 | A | 0.197 | — | — |
| 2 | 97.33 | 2.37 | A | 0.299 | — | — |
| 3 | 97.23 | 2.37 | A | 0.398 | — | — |
| 4 | 97.43 | 2.38 | B | 0.197 | — | — |
| 5 | 97.43 | 2.38 | C | 0.197 | — | — |
| 6 | 97.43 | 2.38 | D | 0.197 | — | — |
| 7 | 97.43 | 2.38 | A | 0.197 | 500 ppm | — |
| 8 | 97.43 | 2.38 | A | 0.197 | 100 ppm | — |
| 9 | 97.43 | 2.38 | A | 0.197 | 500 ppm | 20 ppm |
| 10 | 97.43 | 2.38 | A | 0.197 | 500 ppm | 10 ppm |
| C-1 | 97.42 | 2.38 | — | — | — | — |

Lithographic Testing

Silicon wafers (100 mm or 4 inch diameter) that were vapor primed with hexamethyldisilizane were used as substrates for these lithographic experiments. The vapor priming operation was carried out in a Yield Engineering System LP3 vacuum bake/vapor prime system.

The above-described photoresist was spun on these silicon wafers using an SVG Coater at about 4500 rpm to produce an approximate 12,500 Angstrom coating thickness. The coated wafers were then softbaked at 115° C. for 60 seconds. The wafers were exposed on a Canon Corp. Model FPA-1550 MII Wafer Stepper equipped with a 0.43NA lens with sigma=0.50. Coatings were then developed with each of the above-noted developer solutions in a single spray/puddle that included a 3.5 second spray and 45 second dwell.

The developed coated wafers were inspected and measured in a Hitachi Model S-800 Field Emission Scanning Electron Microscope (SEM). The resulting SEM photographics showed that the developed images had improved process latitude (i.e., less sensitive to changes in focus) compared to the control developer of process Comparison 1. Furthermore, the process of the present invention which used the novolak-containing developer of Examples 1-10 resolved images down to 0.52 microns with near vertical side walls. The Comparison process which used the control developer without novolak was only able to clear down to 0.7 microns with near vertical side walls. Between 0.7-0.55 microns, the Comparison process showed side walls curving toward each other at the bottom of image. At 0.55 microns, the Comparison process did not resolve images. Still further, the Comparison process showed undesirable rails on either side of the top of imaged lines even at 1.0 micron resolution. These rails are undesirable because they may shed particles into the imaged spaces in subsequent processing steps, thereby possibly causing electrical short circuits. The developed images of Examples 1-10 did not show these undesirable rails. Even further, the combination of the above-noted photoresist formulation and a developer of Examples 1-10 may be employed to obtain images having about 0.6-0.5 micron resolution without the need for a post exposure bake step. Previously, when the above-noted photoresist formulation was imaged and developed using other conventional developers, a post exposure bake step was needed for good resolution in this range of 0.6-0.5 microns.

EXAMPLES 11-30 AND COMPARISON 2

Photoresist Components and Formulation

The same photoresist components and method of formulating which was used for Examples 1-10 and Comparison 1 were used for these Examples.

Developer Formulations

Twenty-one more developer formulations were prepared employing deionized water, tetramethylhydroxide (TMAH), a novolak-type resin, and various surfactants or defoamers or both.

For each of these Examples, the novolak resin used was Novolak A.

Each of these Examples contained a base developer containing approximately the following amounts of deionized water, TMAH and novolak resin.

| Ingredient | (% by wt.) |
|---|---|
| Deionized Water | 97.42 |
| TMAH | 2.38 |
| Novolak A | 0.20 |
| | 100.00 |

The amounts of each wetting surfactant added to this base developer solution were either 100, 50% or 1000 parts by weight per million parts of the base developer solution. These parts by million equal 0.01%, 0.05% and 0.1% as indicated in Table 2 below.

The amounts of each defoamer added to this base developer solution were either 10, 20, 80 or 1000 parts by weight per million parts of the base developer solution. These parts by million equal 0.001%, 0.002%, 0.008% and 0.1% by weight as indicated in Table 2 below.

The following wetting surfactants were employed in these Examples:

Surfactant F is Poly-Tergent S-305 LF, surfactant G is Poly-Tergent S-405 LF and surfactant H is Poly-Tergent P-17A. All of the Poly-Tergent series used are commercially available from Olin Chemicals of Stamford, Conn. 06904.

Surfactant I is PIONIN P-4050-T commercially available from Takemoto Oil & Fat Co., Ltd. of 2-5-Minatomachi, Gamagori, Aichi, Japan.

Surfactant J is marlophen 89 commercially available from Huls of Poscfach, Germany.

Surfactant K is SURFYNOL 440 ethoxylated tetramethyldecynediol which is the reaction product of ethylene oxide with 2,4,7,9-tetramethyl-5-decyn-4,7- diol available from Air Products and Chemicals, Inc. of Allentown, Pa. 18195.

The following defoamers were employed in these Examples:

Defoamer L is SAG10 which is 10% dimethylpolysiloxane emulsion. Defoamer M is SAG1010 which is the newer version of SAG10. Both silicone antifoam emulsions are commercially available from Union Carbide Corporation of Danbury, Conn. 06817.

Defoamer N is Bubble Breaker 625 and defoamer O is Bubble Breaker 3056A which are both commercially available from Witco Corporation of New York, N.Y. 10022.

Defoamer P is 2-Ethyl-1-hexanol commercially available from Aldrich Chemical Company, Inc. of Milwaukee, Wis. 53233.

Physical Testing

A) Solubility—Solubility was measured by placing 1000 ppm of said surfactant/defoamer in the base developer formulation. After mixing by shaking, if the developer looked transparent, then the surfactant/defoamer was labeled as GOOD. If the developer had a hazy appearance the surfactant/defoamer was labeled as having a LOW solubility, and if the surfactant/defoamer was not miscible with the developer it was called POOR.

B) Film Thickness Loss (FTL)—The same processing conditions as described in Examples 1-10, with the exception that no exposure step was carried on, were used to process the wafers for FTL for Examples 11-30.

The wafers were measured for film thickness of the resist coating by employing a Sloan Technology Corporation Dektak IIA surface profiler. The film thickness was measured after soft bake, then the same wafer was measured for film thickness loss after development. The film thickness measurements made after development was subtracted from the soft bake film thickness (FT) value to give a number that represents the FT loss or FTL.

A FTL value of >300A was labeled "high" and a value ≦300A was labeled "O.K."

TABLE 2

| Ex-ample | Surfactant Type | (% By Wt.) | Defoamer Type | (% By Wt.) | Physical Test Results Solubility | FTL |
|---|---|---|---|---|---|---|
| 11 | F | 0.05% | — | — | good | high |
| 12 | G | 0.05% | — | — | good | high |
| 13 | H | 0.10% | — | — | good | O.K. |
| 14 | H | 0.05% | — | — | good | O.K. |
| 15 | I | 0.10% | — | — | good | O.K. |
| 16 | I | 0.05% | — | — | good | O.K. |
| 17 | J | 0.10% | — | — | good | high |
| 18 | J | 0.05% | — | — | good | high |
| 19 | J | 0.01% | — | — | good | high |
| 20 | K | 0.05% | — | — | good | O.K. |
| 21 | K | 0.01% | — | — | good | O.K. |
| 22 | K | 0.05% | N | 0.008% | good | n.m. |
| 23 | K | 0.05% | L | 0.008% | good | O.K. |
| 24 | K | 0.05% | L | 0.002% | good | O.K. |
| 25 | K | 0.01% | L | 0.002% | good | O.K. |
| 26 | — | — | L | 0.002% | low | O.K. |
| 27 | — | — | M | 0.002% | low | O.K. |
| 28 | — | — | N | 0.001% | good | O.K. |
| 29 | — | — | O | 0.001% | good | high |
| 30 | — | — | P | 0.10% | poor | n.m. |
| C-2 | — | — | — | — | N.M. | O.K. | n.m. = not measured

The TMAH normality for the developer solutions of Examples 1-30 was about 0.260 Normal. A further study was carried out to determine the optimum TMAH normality with respect to process latitude for g-line steppers. In particular, the developer solution of Example 25 was evaluated having the following alternative TMAH normalities:

0.260 Normal TMAH
0.245 Normal TMAH
0.230 Normal TMAH

The 0.245 normal developer gave a broader (better) process latitude than the 0.260 normal developer. The 0.230 normal developer could be used but required a longer developer time (or a higher exposure energy to expose the resist). Thus, the 0.245 normality was chosen for the best choice, however, it should be noted that other normalities may be used for specific applications.

What is claimed is:

1. The process of developing an image-wise exposed positive-working photoresist-coated substrate comprising the steps of:
    (1) coating said substrate with a radiation-sensitive composition useful as a photoresist; said composition comprising an admixture of:
        (a) at least one alkali-soluble binder resin;
        (b) at least one photoactive compound; and
        (c) a sufficient amount of at least one solvent to dissolve (a) and (b); subject to the proviso that said photoactive compound (b) is a mixture of fully and partially esterified o-naphthoquinone diazide esters of a polyhydroxyaromatic compound having at least four hydroxyl groups capable of being esterified by said diazide groups;
    (2) subjecting said coating on said substrate to an image-wise exposure of radiation energy; and
    (3) subjecting said image-wise exposed coated substrate to a developing solution to form an image-wise pattern in the coating, said developing solution comprising an aqueous solution of tetramethylammonium hydroxide which contains about 0.1% to about 1.0% by weight of a novolak-type resin.

2. The process of claim 1 wherein said alkali-soluble binder resin is a phenolic novolak resin.

3. The process of claim 2 wherein said photoactive compound is prepared by condensing spirobiindane or spirobchroman derivatives with 1.2-naphthoquinonediazide-5-sulfonyl chloride or 1,2-naphthoquinonediazide-4-sulfonyl chloride.

4. The process of claim 3 wherein the solvent is ethyl lactate or a mixture of ethyl lactate and ethyl 3-ethoxy propionate.

5. The process of claim 1 wherein said novolak-type resin, in said developing solution, is the reaction product of a mixture of meta-cresols and para-cresols reacted with formaldehyde, the weight percentages of the cresols being from about 25% meta-cresol and 75% para-cresol to about 75% meta-cresol and 25% para-cresol.

6. The process of claim 1 wherein said coating operation is carried out by spin-coating.

7. The process of claim 1 wherein said imaging step is carried out using ultraviolet light.

8. The process of claim 1 wherein said developing step is carried out using spray/puddle development.

9. The process of claim 1 wherein said developer solution comprises:
    (a) about 2.0-2.5% by weight tetramethylammonium hydroxide;

(b) about 0.1–0.5% by weight of a novolak resin found by the reaction of a cresol mixtures of m-cresol and p-cresol with formaldehyde;

(c) about 0.01 to 0.10% be weight of an ethoxylated tetramethyldecynediol surfactant;
(d) about 0.001–0.01% by weight dimethylpolysiloxane emulsion defoamer; and
(e) balance being water.

* * * * *